United States Patent
Kawakami

[11] Patent Number: 6,008,992
[45] Date of Patent: Dec. 28, 1999

[54] LOCKING DEVICE

[75] Inventor: Hirokazu Kawakami, Tokyo, Japan

[73] Assignee: NEC Corporation, Tokyo, Japan

[21] Appl. No.: 09/234,995

[22] Filed: Jan. 21, 1999

[30] Foreign Application Priority Data

Feb. 5, 1998 [JP] Japan .................. 10-024232

[51] Int. Cl.⁶ .............. H05K 7/16; H05K 5/00; G06F 1/16
[52] U.S. Cl. ............. 361/726; 361/685; 361/683; 361/731; 361/732; 361/747; 312/333; 369/75.1; 292/137
[58] Field of Search .................... 361/726, 685, 361/679, 683, 725, 732, 740, 747, 686, 731; 360/97.01, 98.01, 137, 137 D; 312/332.1, 333; 369/75.1–82; 292/132, 175, 145, 163, 164; 70/38 A, 38 C

[56] References Cited

U.S. PATENT DOCUMENTS

| | | | |
|---|---|---|---|
| 4,551,975 | 11/1985 | Yamamoto et al. | 60/528 |
| 4,644,521 | 2/1987 | Davis et al. | 369/291 |
| 4,806,815 | 2/1989 | Honma | 310/307 |
| 4,896,777 | 1/1990 | Lewis | 211/41 |
| 5,077,722 | 12/1991 | Geist et al. | 369/75.1 |
| 5,117,661 | 6/1992 | Carl et al. | 70/14 |
| 5,136,862 | 8/1992 | Langen | 70/14 |
| 5,305,180 | 4/1994 | Mitchell et al. | 361/685 |
| 5,355,272 | 10/1994 | Kung | 360/137 |
| 5,526,226 | 6/1996 | Katoh et al. | 361/680 |
| 5,618,066 | 4/1997 | Fu-Hsiang | 292/62 |
| 5,637,984 | 6/1997 | Chu | 322/8 |
| 5,687,592 | 11/1997 | Penniman et al. | 70/14 |
| 5,831,820 | 11/1998 | Huang | 361/686 |
| 5,868,013 | 2/1999 | Julien | 70/38 A |

*Primary Examiner*—Leo P. Picard
*Assistant Examiner*—Anatoly Vortman
*Attorney, Agent, or Firm*—Whitham, Curtis & Whitham

[57] ABSTRACT

The present invention provides a locking device having a simplified and energy saving configuration that assures to prevent an unintentional erroneous removal of a container case in operation mode from an apparatus main body. The locking device comprises: first engagement device which is an engagement hole 10 provided in an electronic apparatus main body 1; and second engagement device provided in a disc container case 2 that is inserted into and removed from the electronic apparatus through an opening 1a of the electronic apparatus main body 1. The second engagement device includes a movable engagement piece 21 constituted to be movable toward the engagement hole 10 and a movement urging mechanism 23 for urging this movable engagement piece 21. This movement urging mechanism 23 consists of a working member 23A made from a shape-memory alloy that change its distance from a first end to a second end when subjected to a heat; and a fixed base 24 for fixing the second end of the working member 23A.

18 Claims, 11 Drawing Sheets

(A)

(B)

LOCKING DEVICE

BACKGROUND OF THE INVENTION

1. Field of the Invention

The present invention relates to a locking device and in particular, to a locking device including a fixed engagement piece and a movable engagement piece for locking a container case to be contained in an apparatus including an electronic apparatus, to a main body of the electronic apparatus.

2. Description of the Related Art

Conventionally, a locking device having a fixed engagement piece (first engagement means) and a movable engagement piece (second engagement means) has been widely used in various industrial fields.

For example, in a note type personal computer 100, when replacing a disc storage apparatus 110, the disc storage apparatus 110 is removed from the bottom of the note type personal computer 100 by shifting an inject lever 102 serving as stopper means.

That is, in the aforementioned current note type personal computer, regardless of the operation state of the note type personal computer, the inject lever 102 can be shifted manually so as to take out the disc storage apparatus 110 in a direction indicated by A.

Here, FIG. 14 is a perspective view showing the note type personal computer 100 placed upside down.

In the conventional example of FIG. 14, the disc storage apparatus 110 can be removed even if the disc storage apparatus 110 is being accessed. The same applies to various other apparatuses.

Accordingly, there is a danger that the disc storage apparatus 110 is removed erroneously, resulting in a runaway of software being executed or a destruction of the disc storage apparatus (hardware) itself. In electric apparatuses other than electronic apparatuses, it is not preferable that a case contained is removed during its operation.

SUMMARY OF THE INVENTION

It is therefore an object of the present invention to provide a locking device of a simple configuration capable of eliminating an erroneous removal of a container case from an apparatus main body during an operation mode.

The locking device according to the present invention comprises: first engagement means provided in an apparatus main body; and second engagement means provided in a container case to be inserted into the apparatus main body through an opening of the apparatus main body in such a manner that the second engagement means is engaged with the first engagement means for locking the container case to the apparatus main body, the second engagement means including: a movable engagement piece that can be moved toward the first engagement means; and a movement urging mechanism having one end connected to the movable engagement piece so as to urge the movable engagement piece;

wherein the movement urging mechanism includes: a working member made from a shape-memory alloy whose length between a first end and a second end is changed when subjected to a heat and having the first end connected to the movable engagement piece; and a fixed member for holding the second end of the working member.

It is preferable that the locking device according to the present invention have a guide portion for guiding the movable engagement piece to move toward the first engagement means. The guide portion may be a through hole.

Accordingly, in the locking device according to the present invention, the movable engagement piece is moved by a deformation force of the working member and the shrinking function of the return spring so as to be inserted into and retrieved from an engagement hole of the first engagement means through the through hole of the disc container case. Here, the movement of the movable engagement piece is regulated by a stopper so as not to be removed from the through hole.

When the apparatus main body is in operation (power source ON), an electric current is applied to the working member made from the shape-memory alloy, the working member increases its temperature by the resistance heat and is deformed into its original straight form. A strong force is obtained from this deformation process.

That is, this working member is made from a shape-memory alloy extending into its original straight state when subjected to a heat, so as to push out the movable engagement piece against the shrinking force of the return spring. Thus, the movable engagement piece protrude from the container case through the guide through hole, so that the tip end of the movable engagement piece is engaged with the engagement hole of the apparatus main body. Thus, the container case is locked to the apparatus main body.

On the other hand, when the power is OFF, the working member has no extending force to compete with the shrinking force of the return spring and accordingly, it is deformed into its curved shape. Moreover, the movable engagement piece is stopped at the position of the stopper without protruding from the container case as shown in FIG. 1 to FIG. 3. In this case, the container case can be removed from the apparatus main body 1.

Here, a guide portion may be provided on a wall of the container case for guiding the movement of the movable engagement piece toward the first engagement means. In this case, the guide portion may have a circular or rectangular cross section so as to match the cross section of the movable engagement piece.

According to another aspect of the invention, the locking device comprises: second engagement means provided in an apparatus main body; and first engagement means provided in a container case to be inserted into the apparatus main body through an opening of the apparatus main body in such a manner that the first engagement means is engaged with the second engagement means for locking the container case to the apparatus main body, the second engagement means including: a movable engagement piece that can be moved toward the first engagement means; and a movement urging mechanism having one end connected to the movable engagement piece so as to urge the movable engagement piece, wherein the movement urging mechanism includes: a working member made from a shape-memory alloy whose length between a first end and a second end is changed when subjected to a heat and having the first end connected to the movable engagement piece; and a fixed member for holding the second end of the working member.

In this locking device, the second engagement means is provided in the apparatus main body. Accordingly, more space is available in the container case, and the container case can be reduced in size. This reduces the load required for inserting and removing this container case into/from the apparatus main body.

In this case also, a guide portion may be provided on a wall of the apparatus main body for guiding the movement of the movable engagement piece toward the first engagement means. The guide portion may have a circular or rectangular cross section so as tom match with the cross section of the movable engagement piece.

According to still another aspect of the present invention, the working member has a curved shape at a room temperature and is deformed into a straight shape when subjected to a heat, and the fixed member is arranged at a position opposite to the first engagement means in a movement direction of the movable engagement piece.

This enables obtaining a smooth return of the movable engagement piece to its original position upon stop of the operation.

Here, the working member may have a plate shape of a predetermined width curved at a room temperature and extending into a straight plate when subjected to heat. This enables the working member to effectively exhibit return force to its original position with respect to the movable engagement piece.

Moreover, the working member may have a wire shape having a circular cross sectional view, curved at a room temperature and extending into a straight wire when subjected to a heat. This enables reducing the size and weight of the movement urging mechanism, which in turn enables to reduce the size and weight of the locking device.

According to yet another aspect of the present invention, a return spring is further provided between the fixed member and the movable engagement piece for returning the movable engagement piece to its original position.

This enables to obtain a further smooth return of the movable engagement piece to its original position.

Here, the return spring may be arranged so as to surround the working member. In this case, the spring fluctuates following the shape of the working member. This enables saving space, reducing the size of the entire locking device.

According to yet still another aspect of the present invention, a stopper mechanism is further provided in a region of reciprocal movement of the movable engagement piece for regulating a movement distance of the movable engagement piece.

This enables defining in advance the movement distance of the movable engagement piece as well as obtaining a rapid locking operation.

Here, the stopper mechanism may include: a groove formed on the movable engagement piece along a movement direction of the movable engagement piece, and a guide piece having a protrusion protruding into the groove and fixed on a wall where the guide portion is formed. This enables reducing the size and weight of the stopper mechanism.

Moreover, the stopper mechanism may include two standing members extending from a floor of the container case and arranged so as to sandwich the working member. In this case, the movable engagement piece may have a flange facing the stopper mechanism.

The flange helps to effectively stop the movable engagement piece at the standing members, enabling to reduce the size of the movable engagement piece.

According to yet another aspect of the present invention, the apparatus main body is a main body of an electronic apparatus such as a personal computer, and the container case is a disc container case for containing a disc storage apparatus.

The locking device enables preventing unintentional removal of the disc storage apparatus during an operation of the electronic apparatus such as a personal computer as well as reducing the size of entire apparatus.

According to still yet another aspect of the present invention, there is provided a locking device comprising: first engagement means provided in a main body of an electronic apparatus such as a personal computer; and second engagement means provided in a container case to be inserted into the electronic apparatus main body through an opening of the electronic apparatus main body in such a manner that the second engagement means is engaged with the first engagement means for locking the container case to the electronic apparatus main body, the second engagement means including: a movable engagement piece that can be moved toward the first engagement means; and a movement urging mechanism having one end connected to the movable engagement piece so as to urge the movable engagement piece, wherein the movement urging mechanism includes:

a working member made from a shape-memory alloy whose length between a first and a second end is changed when subjected to a heat and having the first end connected to the movable engagement piece;

a fixed member for holding the second end of the working member; and a current controller operated according to an instruction from a main controller provided in the electronic apparatus main body, so as to apply a predetermined heating current to the working member.

Thus, when a read/write control signal from the main controller (such as HDC in a hard disc apparatus) can be used for deciding whether to apply a current to the working member made from the shape-memory alloy, the main controller decides whether the disc storage apparatus is being accessed (busy state) or not (ready state). According to this information, the current controller applies a current to the working member while the disc storage apparatus is being accessed, and no current while the disc storage apparatus is not being accessed. Thus, it is possible to assure the locking function during the access (busy) state.

BRIEF DESCRIPTION OF THE DRAWINGS

FIG. 7A shows a non-locked state; and FIG. 7B shows a locked state.

DESCRIPTION OF THE PREFERRED EMBODIMENTS

Description will now be directed to an embodiment of the present invention with reference to the attached drawings.

Figure 1:
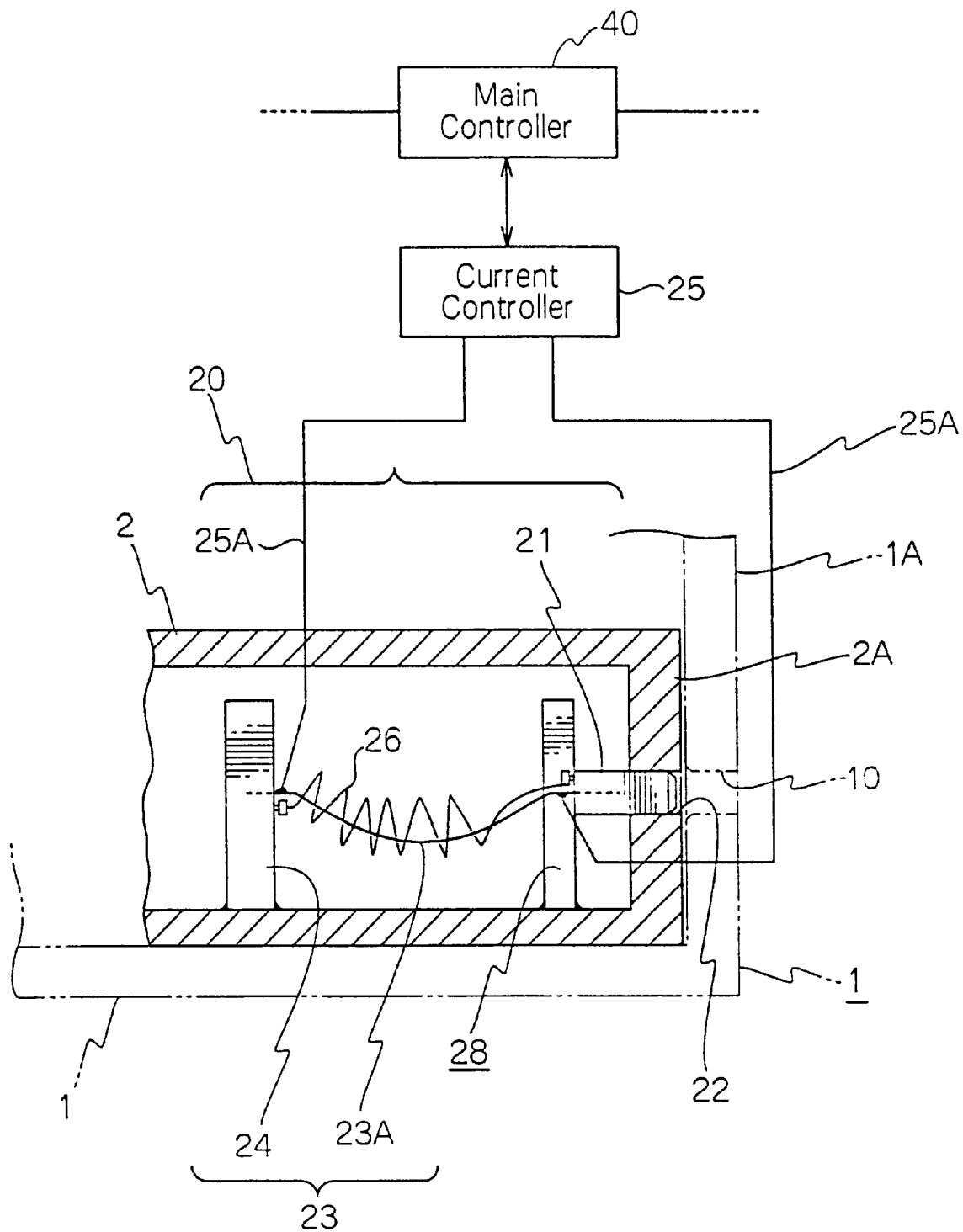
FIG. 1 is a block diagram showing a configuration of a locking device according to an embodiment of the present invention.
Figure 2:
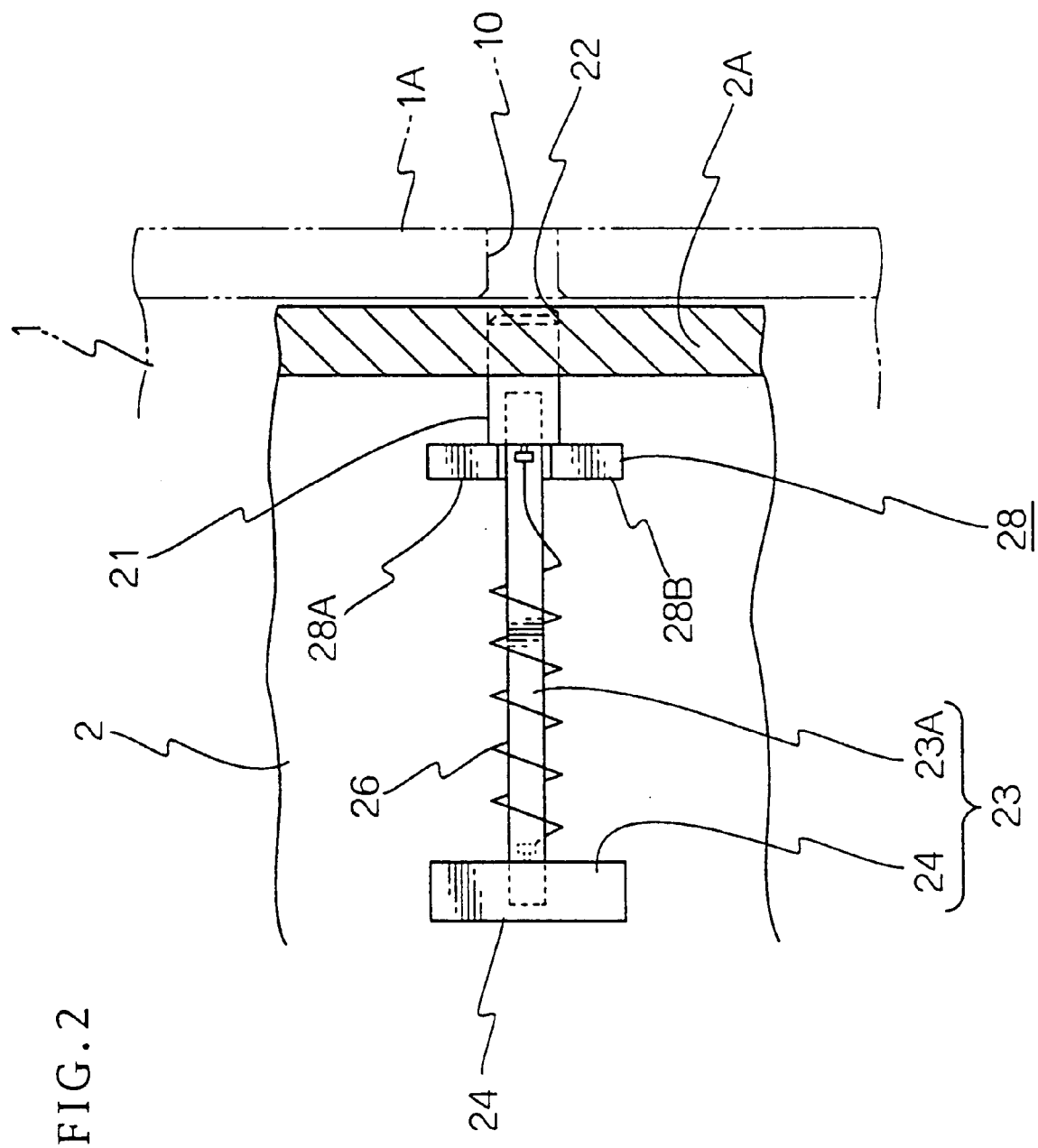
FIG. 2 is plan view partially having a cross sectional view showing second engagement means shown in FIG. 1.
Figure 3:
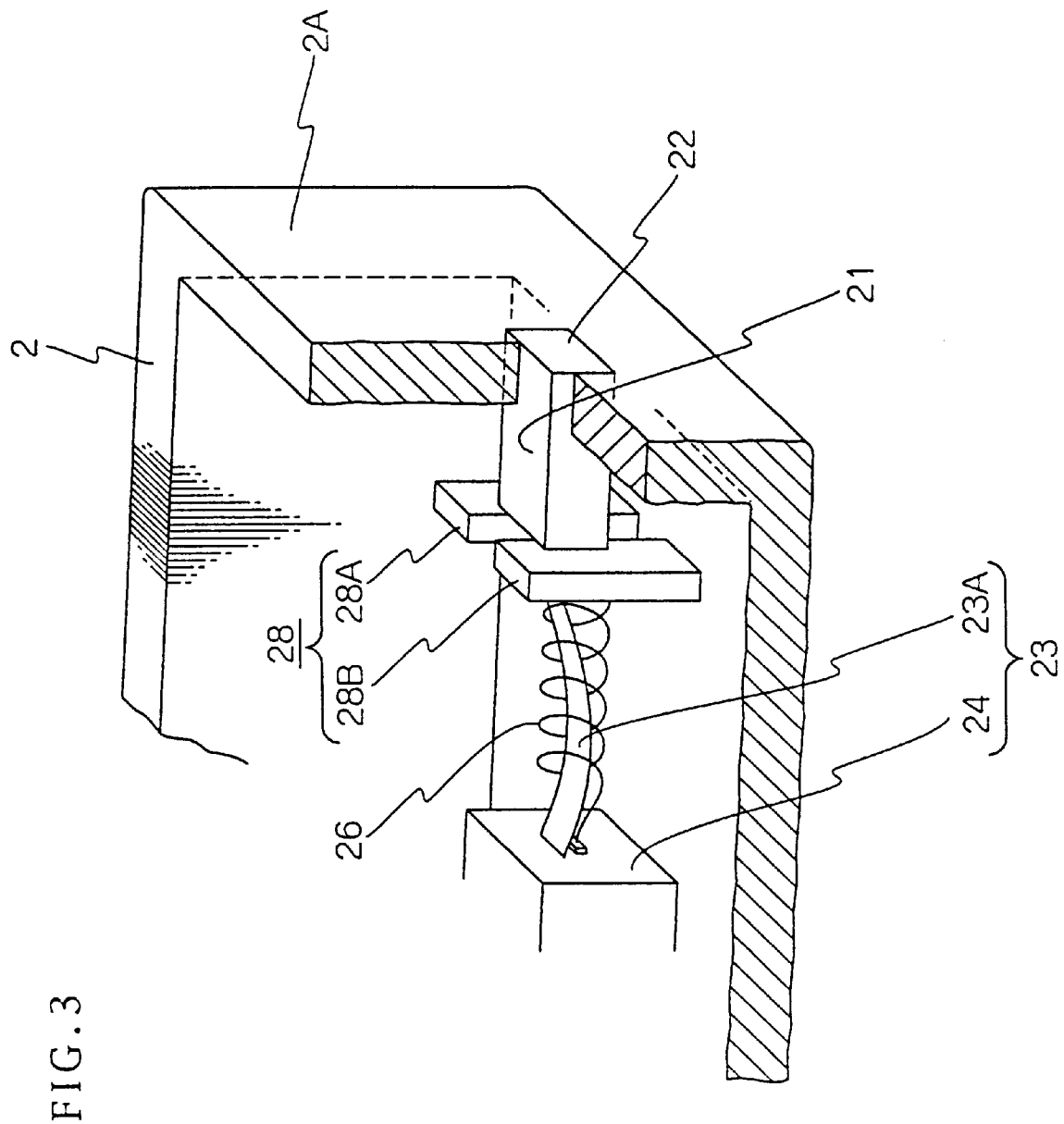
FIG. 3 is a perspective view partially having cross sectional view showing the second engagement means shown in FIG. 1.
Figure 7:
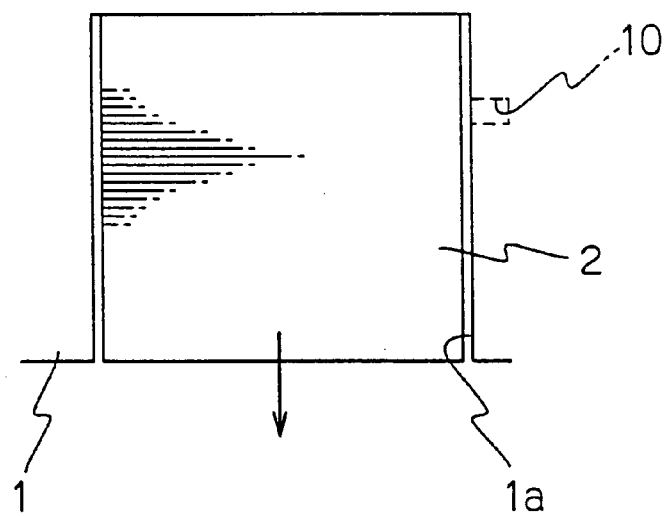
FIG. 7 shows a positional relationship between a disc container case of FIG. 1 and an electronic apparatus main body.
Figure 7:
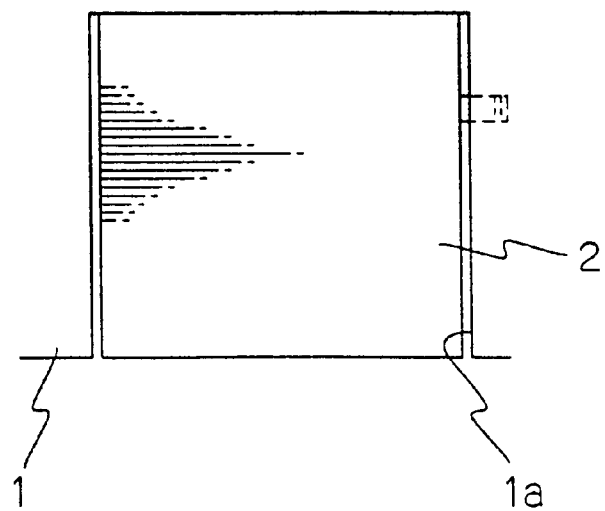

Firstly, in FIG. 1 to FIG. 3, a reference symbol 1 denotes a main body of an electronic apparatus such as a personal computer, and a reference symbol 2 denotes a disc container case 2 as a container case that can be contained in the electronic apparatus main body 1 and can be removed from the electronic apparatus main body 1 through an opening 1a (see FIG. 7). This disc container case 2 in the present invention contains a disc storage apparatus.

The electronic apparatus main body 1 has a flat rectangular shape and has the opening 1a provided on one side. Through this opening 1a, the disc container case 2 is inserted into or removed from the electronic apparatus main body 1.

In FIG. 1, the reference symbol 1A denotes a side wall of the electronic apparatus main body 1, and the reference symbol 2a denotes a side wall of the container case 2. In this side wall 2A of the electronic apparatus main body 1, there is provided an engagement hole 10 as the aforementioned first engagement means. The aforementioned second engagement means 20 is provided in the container case 2.

As shown in FIG. 1 to FIG. 3, this second engagement means 20 includes: a movable engagement piece 21; a guide through hole 22 formed in the side wall 2A of the disc container case 2 for guiding reciprocal movement of the movable engagement piece 21; and a movement urging mechanism 23 having one end linked to the movable engagement piece 21 for urging the movable engagement piece 21.

Here, the guide through hole 22 and the engagement hole 10 the first engagement means are provided in such a manner that their center axes are arranged on a single line, and their cross sectional configurations are almost identical to that of the movable engagement piece 21, and the cross sectional areas are slightly greater than the cross sectional area of the movable engagement piece 21. For locking, the movable engagement piece 21 is moved toward the side wall 1A of the electronic apparatus main body 1 so that its tip end is engaged with the engagement hole 10, thus locking the disc container case 2 into the electronic apparatus main body 1.

The movement urging mechanism 23 includes: a working member 23A having one end linked to the movable engagement piece 21; and a fixed base 24 for fixing the other end of this working member 23A. The movable engagement piece 21 has a columnar shape having a rectangular cross section in this example. However, the movable engagement piece 21 may also have a circular cross section.

Here, the working member 23A is made from a shape memory alloy of nickel-titanium in a plate shape of a predetermined width. The distance between two ends of this shape memory alloy plate is changed by heat. In this case, the shape memory alloy plate as the working member 23A is processed into a curved shape and stays in this shape while no heat is applied, i.e., while no electric current is applied. When the temperature increases due to electric current, the shape memory alloy is deformed into its original shape, i.e., extends into a straight shape.

Figure 4:
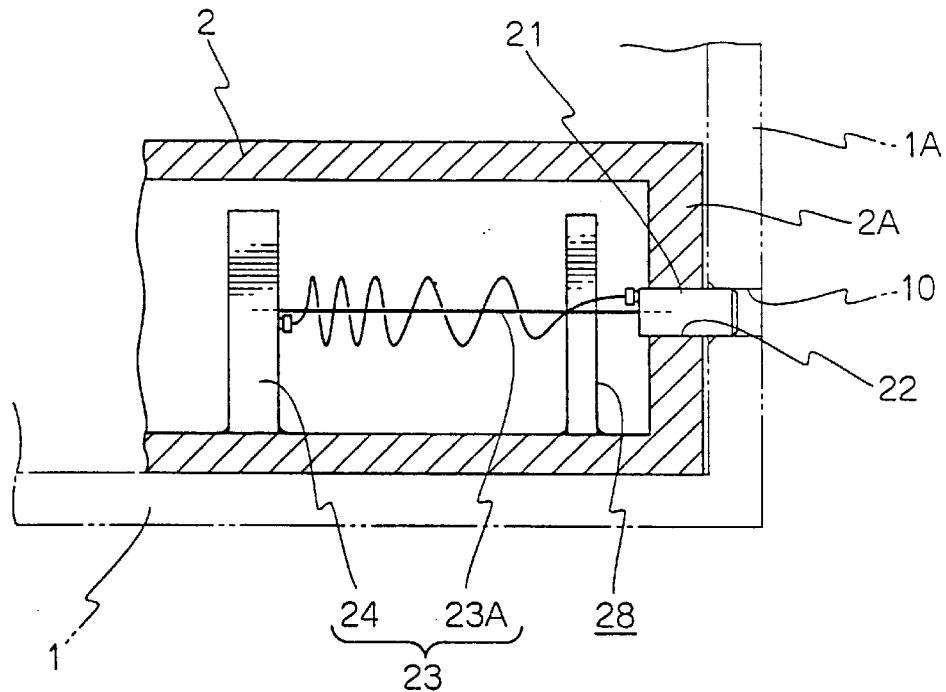
FIG. 4 shows the second engagement means of FIG. 1 in an operation state (locked state)
Figure 5:
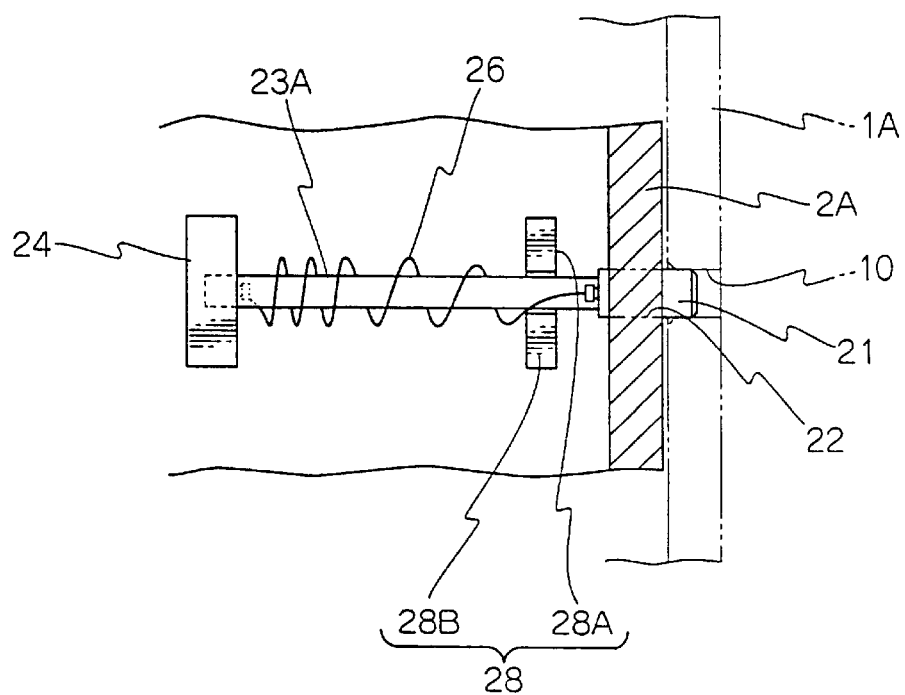
FIG. 5 is a plan view having a partial cross sectional view showing the second engagement means shown in FIG. 4.
Figure 6:
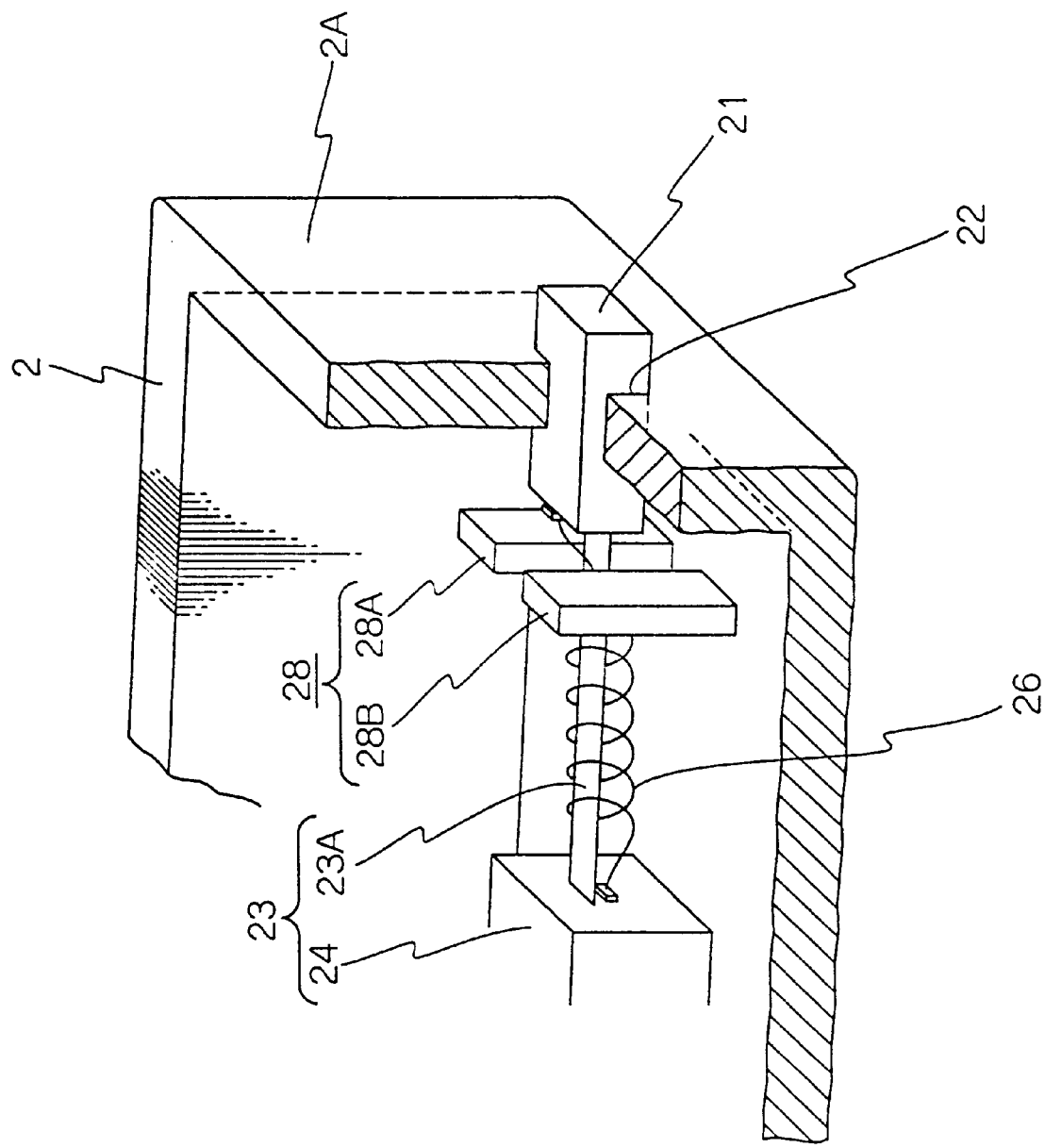
FIG. 6 is a perspective view having a partial cross sectional view showing the second engagement means shown in FIG. 4.

When an electric current is applied to increase the temperature, the working member 23A extends from the curved state into the straight state to urge the movable engagement piece 21 to be pushed rightward in FIG. 1. FIG. 4 to FIG. 6 show the movable engagement piece 21 pushed out.

Here, the working member 23A may also be made from a member having a circular cross section.

The reference symbol 25 denotes a current controller for applying an electric current to the working member 23A to heat the working member 23A made from the shape memory alloy. This current controller 25 operates according to an instruction from a main controller 40, so as to apply at a predetermined timing a predetermined current between the both ends of the working member 23A via a lead line 25A. The working member 23A is heated up to a predetermined temperature and the temperature is maintained during an operation of the electronic apparatus including the personal computer.

Furthermore, as shown in FIG. 1, the working member 23A has one end held by the fixed base 24 and the other end is arranged on a line of the center axis of the guide through hole 22 for guiding the movement of the movable engagement piece 21, so that the working member 23A can operate smoothly according to a temperature change.

Between the fixed base 24 and the movable engagement piece 21, there is provided a return spring 26 for returning to an original position. The return spring 26 is a coil spring as an extension spring. This return spring 26 is arranged so as to surround the working member 23A. Thus, there is no need of providing a particular space for the return spring 26. Because the return spring 26 is a coil spring, it can easily follow a deformation of the working member 23A.

Moreover, a stopper 28 is provided in the area of the reciprocal movement of the movable engagement piece 21 for regulating a movement distance of the movable engagement piece 21. As shown in FIG. 3, the stopper 28 consists of two standing members 28A and 28B extending from the floor plane so as to sandwich the working member 23A.

This stopper 28 defines the start point of the reciprocal movement of the movable engagement piece 21. The movable engagement piece 1 can smoothly return to the original position upon completion of operation.

Next, explanation will be given on the operation of the locking device according to the present embodiment.

Firstly, the current controller 25 controls current to flow into the working member 23A made from the shape memory alloy and operates according to an information from the main controller 40 that performs control of read/write.

The movable engagement member 21 is inserted into or removed from the engagement hole 10 through the guide through hole 22 of the disc container case 2 by the deformation force of the working member 23A or the shrink force of the return spring 26. In this case, when the movable engagement piece 21 is pulled by the return spring 26, the movable engagement piece 21 is regulated by the stopper 28 so as to remain in the through hole 22.

Here, whether to apply a current to the working member 23A is decided using a signal from the main controller 40

(such as HDC in a hard disc apparatus). The main controller 40 indicates whether the disc storage apparatus is in access state (busy state) or no (ready state). According to this information, if the disc storage apparatus is in busy state, the current controller 25 applies a current to the working member 23A, and if the disc storage apparatus in ready state, the current controller 25 applies no current to the working member 23A.

When the disc storage apparatus is in busy state, current is applied through the lead line 25A to the working member 23A made from the shape memory alloy. When heated by the resistance head, the working member 23A is deformed into its original shape, i.e., to extend into a straight plate. The working member 23A exhibits a strong force in this process. Accordingly, when the temperature is increased, the working member 23A extends to push out the movable engagement piece 21 against the shrinking force of the return spring 26.

Thus, as shown in FIG. 4 to FIG. 6, the movable engagement piece 21 is pushed outward through the guide through hole 22 of the disc container case 2 with its tip end protruding out of the disc container frame 2. In this case, the tip end of the movable engagement piece 21 is engaged with the locking engagement hole 10 of the electronic apparatus main body 1 such as a personal computer. The disc container case 2 containing the disc storage apparatus is locked to the electronic apparatus main body as shown in FIG. 4 to FIG. 7. This assures to prevent erroneous removal of the disc container case 2.

On the other hand, when the disc storage apparatus is in ready state or the power is off, the working member 23A made from the shape memory alloy has no extending force to compete the shrinking force of the return spring 26 and is in a curved shape. The movable engagement piece 21 is pulled by the return spring 26 and stopped at the position of the stopper 28. That is, the tip of the movable engagement piece 21 stays in the guide through hole 22 without protruding from the disc container case 2.

In this case, as shown in FIG. 7A, the disc container case 2 containing the disc storage apparatus can be removed from the electronic apparatus 1 such as a note type personal computer.

Figure 8:
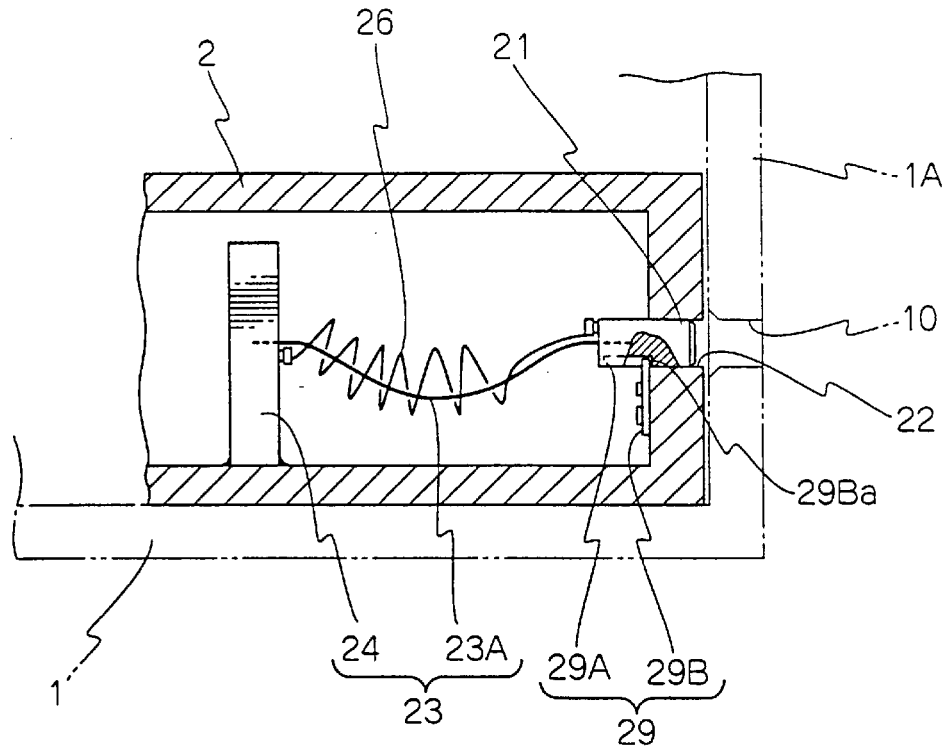
FIG. 8 shows another example of a stopper constituting the second engagement means of FIG. 1.
Figure 9:
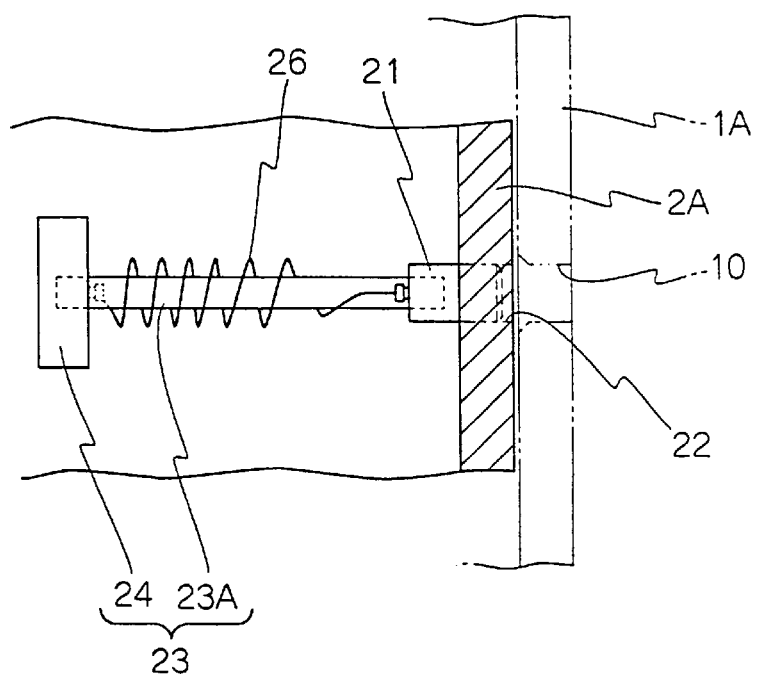
FIG. 9 is a plan view of the stopper shown in FIG. 8.
Figure 10:
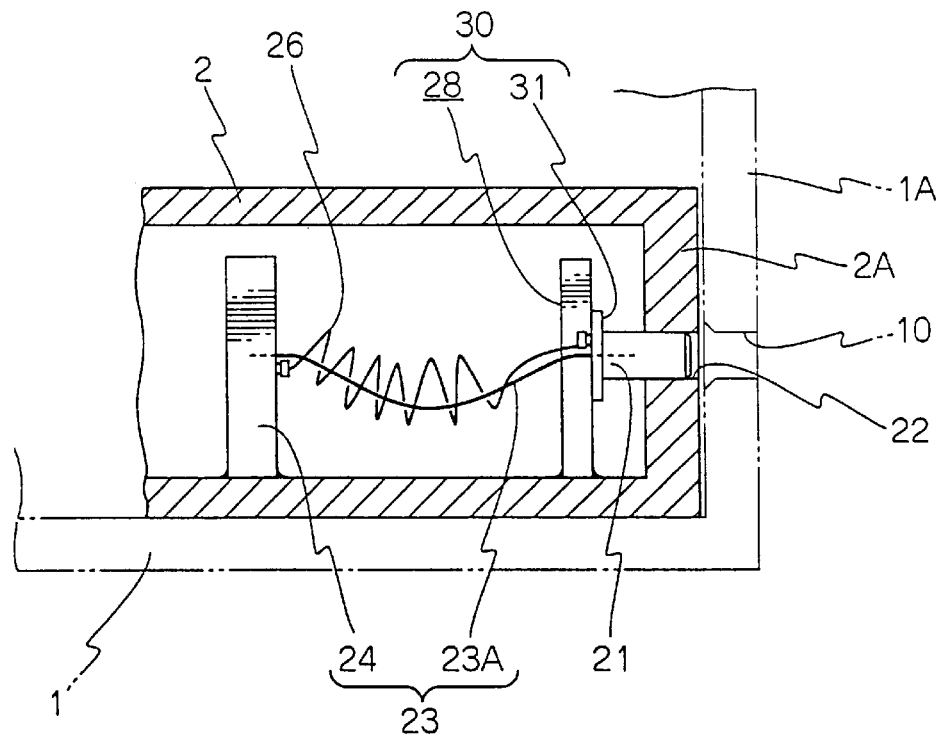
FIG. 10 shows still another example of the stopper constituting the second engagement means of FIG. 1.
Figure 11:
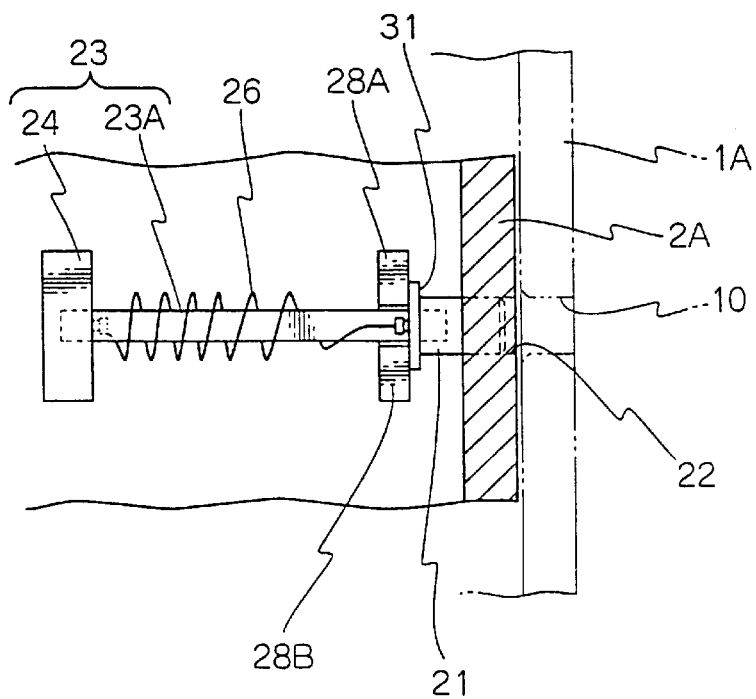
FIG. 11 is a plan view of the stopper of FIG. 10.
Figure 12:
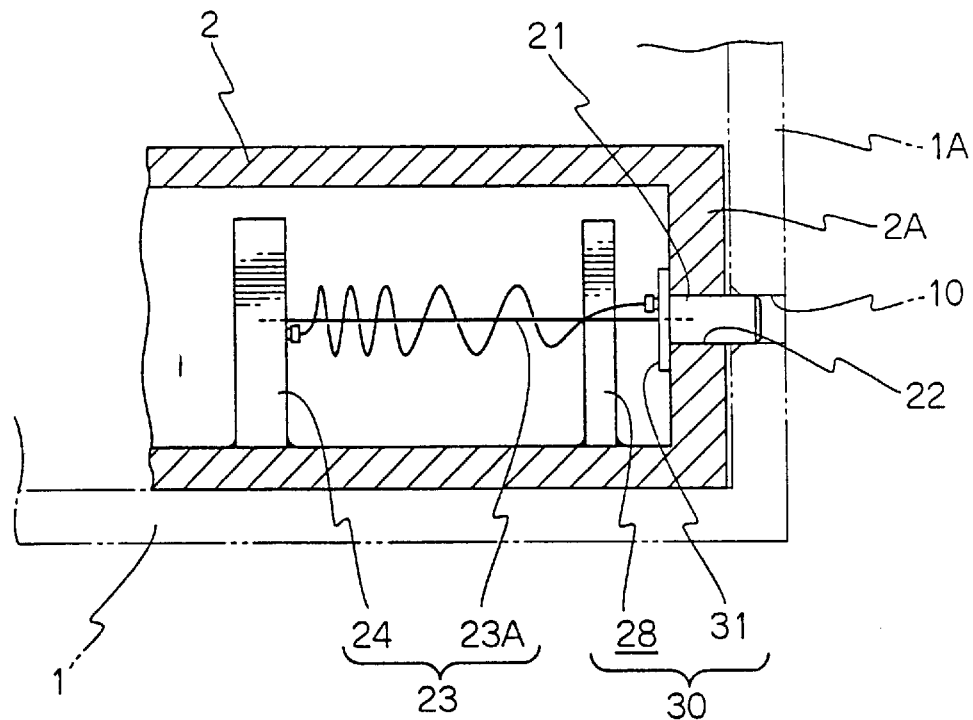
FIG. 12 explains operation of the stopper of FIG. 10.
Figure 13:
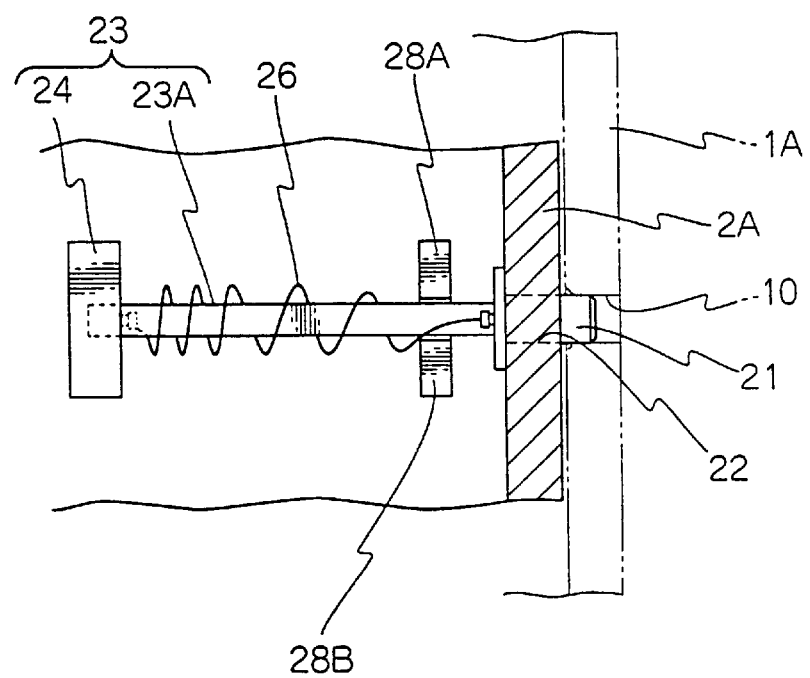
FIG. 13 is a plan view containing a partially cross sectional view showing the stopper of FIG. 10.
Figure 14:
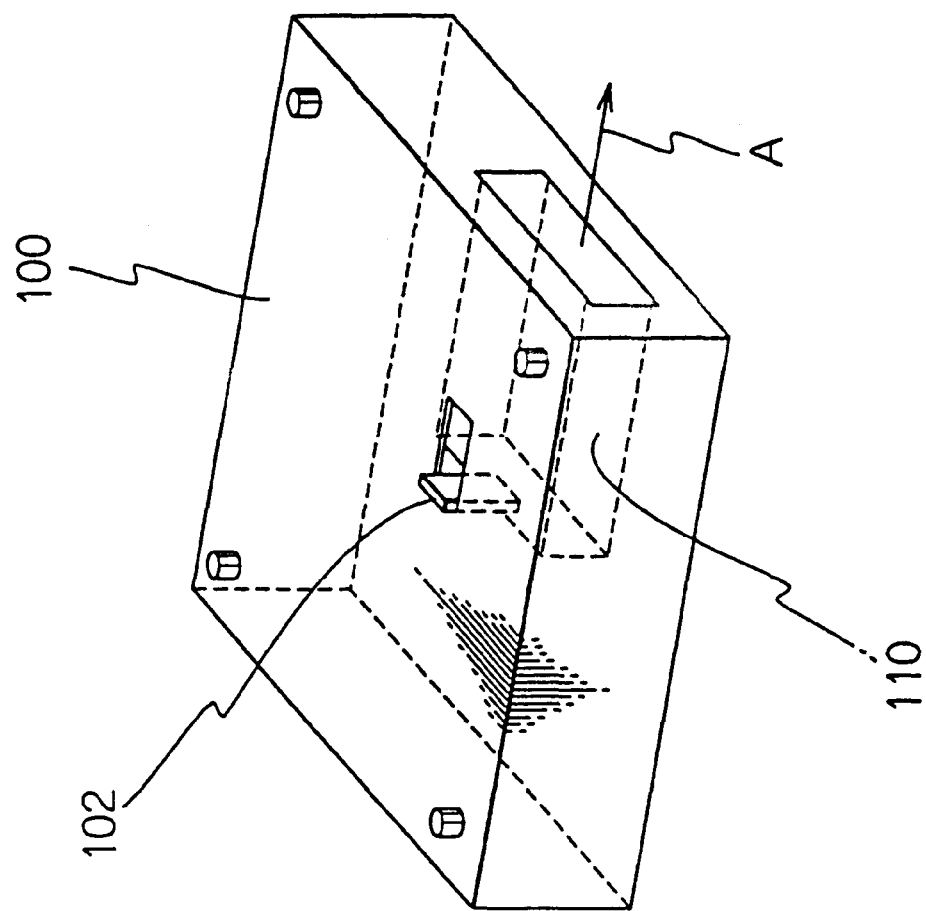
FIG. 14 is a block diagram showing a configuration of an a conventional locking device provided in an electronic apparatus.

Here, the stopper 28 may have a configuration as shown in FIG. 8 (side view) and in FIG. 9 (plan view). The stopper 29 of FIG. 8 and FIG. 9 consists of a groove 29A formed along the movement direction of the movable engagement piece 21 and protrusion 29B having a protrusion 29B*a* protruding in this groove 29A. This guide member 29B is fixed to the side wall 2A of the container case 2 where the guide through hole 22 is formed.

The stopper 29 has a function almost equivalent to the stopper 28, assuring to regulate the operation range of the movable engagement piece 21. The operation range of the movable engagement piece 21 is defined by the length of the groove 29A. Accordingly, it is possible to accurately set the operation range of the movable engagement piece 21. Furthermore, in comparison to the stopper 28 extending from the floor of the container case 2, the stopper 29 utilizes the side wall of the container case 2, minimizing the space occupied by the stopper 29. Because the stopper 29 consists of the groove 29A and the protrusion 29B*a,* the entire stopper 29 can be reduced in size and weight.

Furthermore, the stopper 28 may have a configuration such as a stopper 30 shown in FIG. 10 to FIG. 14. That is, the stopper 30 consists of the aforementioned stopper 28 and a flange 31 provided on the movable engagement piece 21. This configuration provides a function almost equivalent to that of the stopper 28 for regulating the operation range of the movable engagement piece 21. Because the flange 31 assures the movable engagement piece 21 to engage with the standing members 28A and 28B, it is possible to reduce the cross sectional area to the movable engagement piece 21. This enables to reduce the weight of the movable engagement piece 21 as well as to reduce the friction caused by the reciprocal movement. Thus, there is an advantage that it is possible to reduce the load required for the reciprocal movement of the movable engagement piece 21.

In the locking device according to the aforementioned embodiment, an engagement hole as the first engagement means is provided in an electronic apparatus main body 1, and the second engagement means is provided in a disc container case 2. However, it is also possible that the first engagement means is provided in the disc container case and the second engagement means is provided is provided in the electronic apparatus main body 1.

This alternative configuration also has the same function as the aforementioned embodiment. Furthermore, when the second engagement means is provided in the electronic apparatus main body, more space is available for containing a disc storage apparatus in the container case. That is, it becomes possible to reduce the size of the disc container case as well as to reduce the load required for inserting and removing the disc container case into/from the electronic apparatus main body.

The locking device having the aforementioned configuration according to the present invention can assure to prevent to erroneously (unintentionally) remove from a personal computer or other electronic apparatus a disc container case containing a disc storage apparatus which is being accessed. Moreover, the locking device employs a shape memory alloy as a working member, which enables to have a simple configuration as a whole. This enables to reduce a power consumption as well as the size of the locking device.

Figure 15:
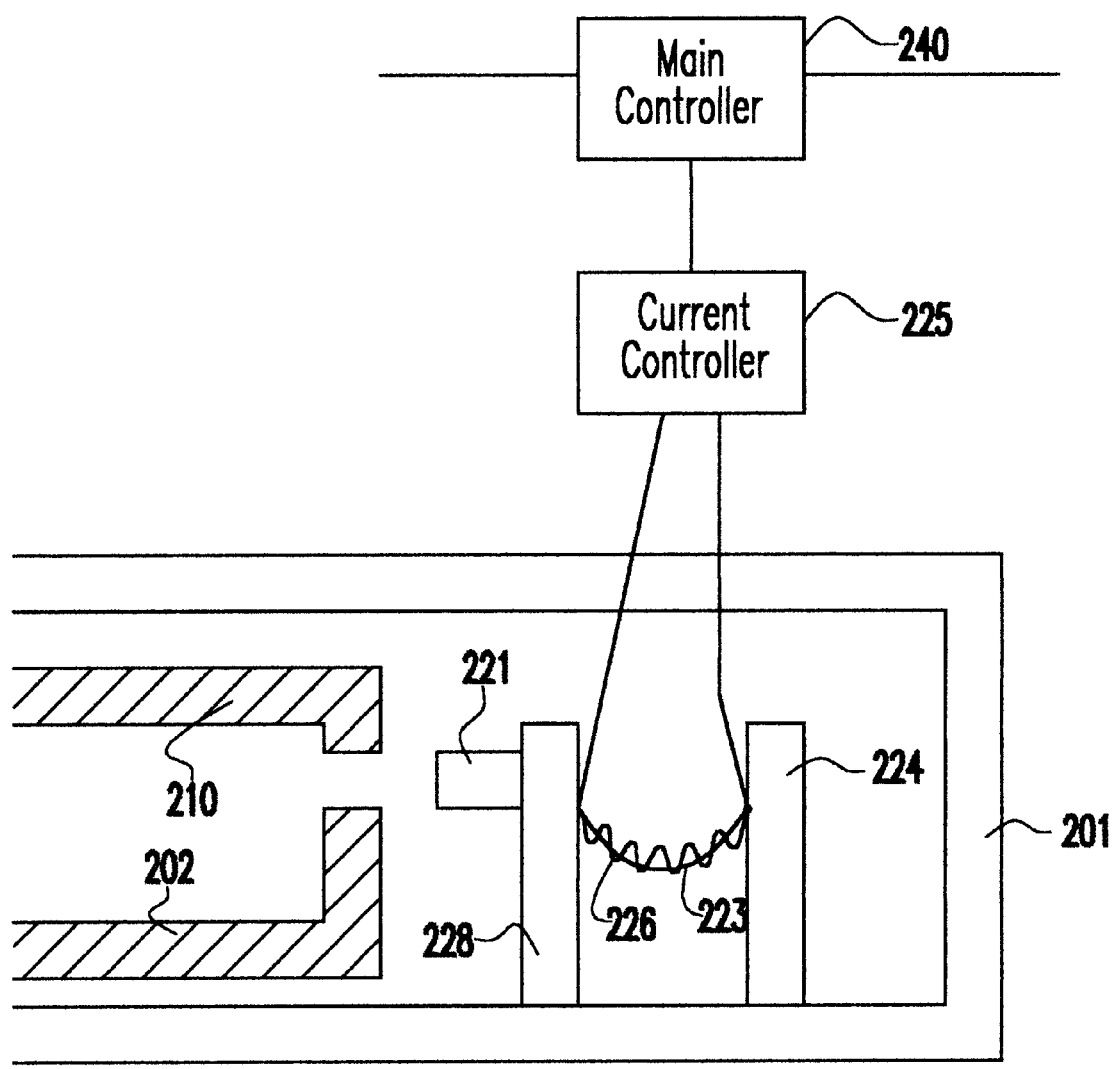
FIG. 15 is a block diagram showing a configuration of a locking device according to an embodiment of the present invention which is essentially opposite to that shown in FIG. 1.

The invention may be embodied in other specific forms without departing from the spirit or essential characteristic thereof. For example, FIG. 15 shows a locking device essentially opposite to that shown in FIG. 1, where the electronic apparatus 201 and container case 202 are selectively locked together by a movable engagement piece 221 which fits within a through hole 210 in the side wall of the container case 202 (FIG. 1 shows the trough hole 10 in the electronic apparatus 1 and the movable engagement piece 21 within the container case 2). A stopper 228 and a fixed base 224 sandwich a working member 223 made from shape memory alloy whose length is changed by heat and a return spring 226 therebetween. In the same manner as described in conjunction with FIGS. 1–6, it can be seen that the current controller 225, operating according to instructions from main controller 240, can cause the working member 223 to heat up, resulting in lengthening which, in turn, results in the engagement piece 221 fitting into through hole 210, thus locking the electronic apparatus 201 and container case 202 together. Similar "reverse" configurations to that shown in FIGS. 8–13 could also be made within the practice of this invention. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 10-024232 (Filed on Feb. 5$^{th}$, 1998) including specification, claims, drawings and summary are incorporated herein by reference in its entirety.

What is claimed is:

1. A locking device comprising:

first engagement means provided in an apparatus main body; and second engagement means provided in a container case to be inserted into said apparatus main body through an opening of said apparatus main body in such a manner that said second engagement means is engaged with said first engagement means for locking said container case to said apparatus main body, said second engagement means including: a movable engagement piece that can be moved toward said first engagement means; and a movement urging mechanism having one end connected to said movable engagement piece so as to urge said movable engagement piece, wherein said movement urging mechanism includes:

a working member made from a shape-memory alloy whose length between a first end and a second end is changed when subjected to a heat and having said first end connected to said movable engagement piece; and a fixed member for holding said second end of said working member.

2. A locking device as claimed in claim 1, wherein said container case has on its wall a guide portion for guiding the movement of said second engagement means toward said first engagement means.

3. A locking device as claimed in claim 2, said guide portion for said second engagement means is a through hole.

4. A locking device comprising:

second engagement means provided in an apparatus main body; and first engagement means provided in a container case to be inserted into said apparatus main body through an opening of said apparatus main body in such a manner that said first engagement means is engaged with said second engagement means for locking said container case to said apparatus main body, said second engagement means including: a movable engagement piece that can be moved toward said first engagement means; and a movement urging mechanism having one end connected to said movable engagement piece so as to urge said movable engagement piece, wherein said movement urging mechanism includes:

a working member made from a shape-memory alloy whose length between a first end and a second end is changed when subjected to a heat and having said first end connected to said movable engagement piece; and a fixed member for holding said second end of said working member.

5. A locking device as claimed in claim 1, wherein said working member has a curved shape at a room temperature and is deformed into a straight shape when subjected to a heat, and wherein said fixed member is arranged at a position opposite to said first engagement means in a movement direction of said movable engagement piece.

6. A locking device as claimed in claim 5, wherein said working member has a plate shape of a predetermined width curved at a room temperature and extending into a straight plate when subjected to a heat.

7. A locking device as claimed in claim 5, wherein said working member has a wire shape having a circular cross sectional view, curved at a room temperature and extending into a straight wire when subjected to a heat.

8. A locking device as claimed in claim 1, said device further comprising a return spring provided between said fixed member and said movable engagement piece for returning said movable engagement piece to its original position.

9. A locking device as claimed in claim 4, said device further comprising a return spring provided between said fixed member and said movable engagement piece for returning said movable engagement piece to its original position.

10. A locking device as claimed in claim 8, wherein said return spring is arranged so as to surround said working member.

11. A locking device as claimed in claim 9, wherein said return spring is arranged so as to surround said working member.

12. A locking device as claimed in claim 1, said device further comprising a stopper mechanism in a region of reciprocal movement of said movable engagement piece for regulating a movement distance of said movable engagement piece.

13. A locking device as claimed in claim 4, said device further comprising a stopper mechanism in a region of reciprocal movement of said movable engagement piece for regulating a movement distance of said movable engagement piece.

14. A locking device as claimed in claim 12, wherein said stopper mechanism includes:

a groove formed on said movable engagement piece along a movement direction of said movable engagement piece, and a guide piece having a protrusion protruding into said groove and fixed on a wall where said guide portion is formed.

15. A locking device as claimed in claim 12, wherein said stopper mechanism includes two standing members extending from a floor of said container case and arranged so as to sandwich said working member.

16. A locking device as claimed in claim 14, wherein said movable engagement piece has a flange facing said stopper mechanism.

17. A locking device as claimed in claim 1, wherein said apparatus main body is a main body of an electronic apparatus such as a personal computer, and said container case is a disc container case for containing a disc storage apparatus.

18. A locking device comprising:

first engagement means provided in a main body of an electronic apparatus such as a personal computer; and second engagement means provided in a container case to be inserted into said electronic apparatus main body through an opening of said electronic apparatus main body in such a manner that said second engagement means is engaged with said first engagement means for locking said container case to said electronic apparatus main body, said second engagement means including: a movable engagement piece that can be moved toward said first engagement means; and a movement urging mechanism having one end connected to said movable engagement piece so as to urge said movable engagement piece, wherein said movement urging mechanism includes:

a working member made from a shape-memory alloy whose length between a first and a second end is changed when subjected to a heat and having said first end connected to said movable engagement piece;

a fixed member for holding said second end of said working member; and a current controller operated according to an instruction from a main controller provided in said electronic apparatus main body, so as to apply a predetermined heating current to said working member.

* * * * *